US 8,142,201 B2
Mar. 27, 2012

(12) United States Patent
Fan (10) Patent No.: US 8,142,201 B2
(45) Date of Patent: Mar. 27, 2012

(54) ELECTRICAL CONNECTOR ASSEMBLY HAVING PICK-UP CAP

(75) Inventor: Chia-Wei Fan, Tu-Cheng (TW)

(73) Assignee: Hon Hai Precision Ind. Co., Ltd., Taipei (TW)

( * ) Notice: Subject to any disclaimer, the term of this patent is extended or adjusted under 35 U.S.C. 154(b) by 412 days.

(21) Appl. No.: 12/512,326

(22) Filed: Jul. 30, 2009

(65) Prior Publication Data

US 2010/0087082 A1  Apr. 8, 2010

(30) Foreign Application Priority Data

Oct. 7, 2008 (TW) .............................. 97217902 U (51) Int. Cl.
*H01R 13/60* (2006.01)
(52) U.S. Cl. ........................... 439/41; 439/135; 439/940
(58) Field of Classification Search .................. 439/41, 439/135, 940, 331, 73, 71
See application file for complete search history.

(56) References Cited

U.S. PATENT DOCUMENTS

| | | | |
|---|---|---|---|
| 7,001,197 B2 | 2/2006 | Shirai et al. | |
| 7,390,202 B2 * | 6/2008 | Ma et al. | 439/135 |
| 7,534,114 B2 * | 5/2009 | Liao | 439/135 |
| 7,575,449 B1 * | 8/2009 | Cai | 439/135 |
| 7,628,615 B2 * | 12/2009 | Lin et al. | 439/41 |

* cited by examiner

*Primary Examiner* — Felix O Figueroa
(74) *Attorney, Agent, or Firm* — Wei Te Chung; Andrew C. Cheng; Ming Chieh Chang (57) ABSTRACT

A pick-up cap includes a main portion having a planar top surface with a first end and a second end opposite to the first end. Four latches are positioned at the two ends of the main portion and extend from the main portion, respectively. Each latch has a hook extending downwardly. And a supporting portion extending downwardly and being adjacent to the hook. The supporting portion is lower than the hook in a vertical direction to engage with an insulative housing to protect the hook during the pick-up cap is disassembled from the insulative housing.

12 Claims, 9 Drawing Sheets

ELECTRICAL CONNECTOR ASSEMBLY HAVING PICK-UP CAP

BACKGROUND OF THE INVENTION

1. Field of the Invention

The present invention relates to an electrical connector assembly, and more particularly to an electrical connector assembly with a pick-up cap, which can protect a latch thereof from breaking resulted from excessive deflection.

2. Description of the Prior Art

U.S. Pat. No. 7,001,197 issued to Shirai on Feb. 21, 2006 discloses a typical electrical connector comprising an insulative housing having a plurality of contacts. The insulative housing has a top surface for receiving an electronic package. A cover is pivotally mounted on a first end of the insulative housing and pivotally rotates between an opened position and a closed position. The cover has an opening in a center area so that an electronic package passes through the opening to electrically connect to the contacts. A lever is pivotally mounted to a second end of the insulative housing. The lever has a locking portion for locking the cover in the closed position. A stiffener is positioned on a bottom surface of the insulative housing. While the electrical connector is put to use, the electronic package presses on top end of the contacts to establish electrical connection between the contacts and the electronic package. The electrical connector typically comprises a pick-up cap mounted to the cover or the insulative housing. The pick-up cap has two main functions: the first is to provide a planar top surface for being readily picked up by a vacuum nozzle of a vacuum device, and then to place the electrical connector assembly onto a printed circuit board; the second function is to use the top surface as a protecting cover for preventing dust and other contamination from coming into the insulative housing to pollute the contacts thereof.

Figure 1:
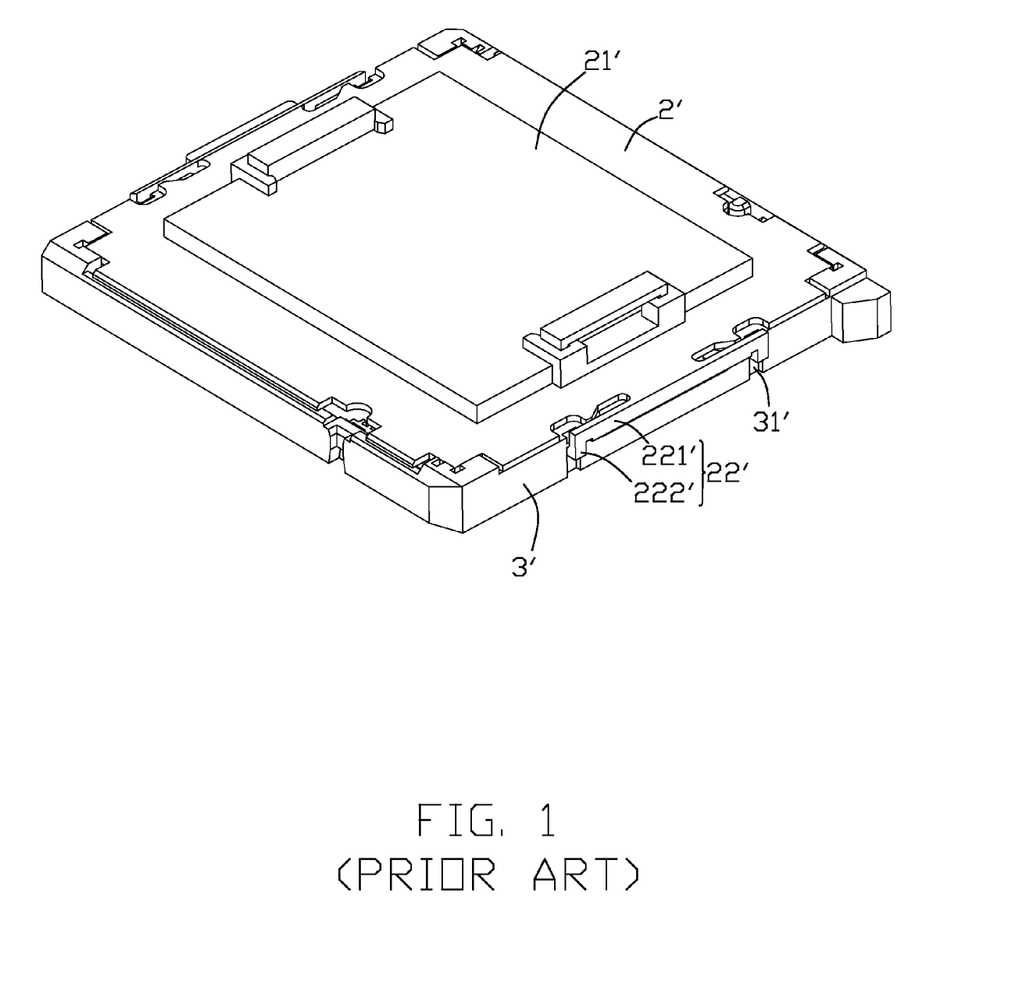
FIG. 1 is an assembled perspective view of a conventional electrical connector.

FIG. 1 shows a conventional electrical connector assembly with a pick-up cap 2'. The electrical connector assembly includes a stiffener having an opening in a center, an insulative housing disposed in the opening of the stiffener, a cover and a lever mounted to two opposite ends of the stiffener, respectively. FIG. 1 omits the stiffener, the cover and the lever, the structure of them are the same with above typical electrical connector. The pick-up cap 2' comprises a main portion 21' with a planar top surface, four latches 22' positioned at a first end and a second end which is opposite to the first end of the pick-up cap 2' for attaching to the insulative housing 3'. Each latch 22' comprises a spring arm 221' extending horizontally from the main portion 21' and a hook 222' extending downwardly from the spring arm 221'. The insulative housing 3' defines four recesses 31' corresponding to the hooks 222' and engaging with the hooks 222'. When taking off the pick-up cap 2' from the insulative housing 3', firstly, lift the first end of the pick-up cap 2', and then remove the pick-up cap 2' from the insulative housing 3'. In above process, the second end will easily trap into a gap between the insulative housing 3' and the stiffener, that may resulting difficult removal of the latches 22' therefrom and in worse scenario, the latches 22' will be broken.

Therefore, it is needed to find a new electrical connector assembly having an improved pick-up cap to overcome the problems mentioned above.

SUMMARY OF THE INVENTION

Accordingly, an object of the present invention is to provide an electrical connector assembly having a pick-up cap which can protect a latch thereof from breaking, resulted from excessive deflection.

In order to achieve the object set forth, a pick-up cap comprises a main portion having a planar top surface with a first end and a second end opposite to the first end. At least two latches are positioned at the two ends of the main portion and extend from the main portion, respectively. Each latch has a hook extending downwardly. At least one supporting portion extends downwardly from at least one of the first and the second ends and is lower than the hook in a vertical direction.

In order to further achieve the object set forth, an electrical connector assembly, comprises a frame having an opening thereof, an insulative housing positioned in the opening of the frame, a pick-up cap assembled to the insulative housing and having a first end and a second end opposite to the first end. The insulative housing has a cavity in a center thereof and a plurality of recesses defined on outer walls. The pick-up cap comprises a main portion having a planar top surface, a plurality of latches extending from the two ends of the main portion and corresponding to the recesses, respectively. Each latch has a hook extending downwardly for engaging with the recesses of the insulative housing. A supporting portion is formed on at least one of the first and the second ends of the pick-up cap and extends downwardly from the pick-up cap, the supporting portion is arranged lower than the hook so that the supporting portion abut against the outer wall while disassembling the pick-up cap from the insulative housing.

DESCRIPTION OF PREFERRED EMBODIMENT

Reference will now be made to the drawings to describe the present invention in detail.

Figure 2:
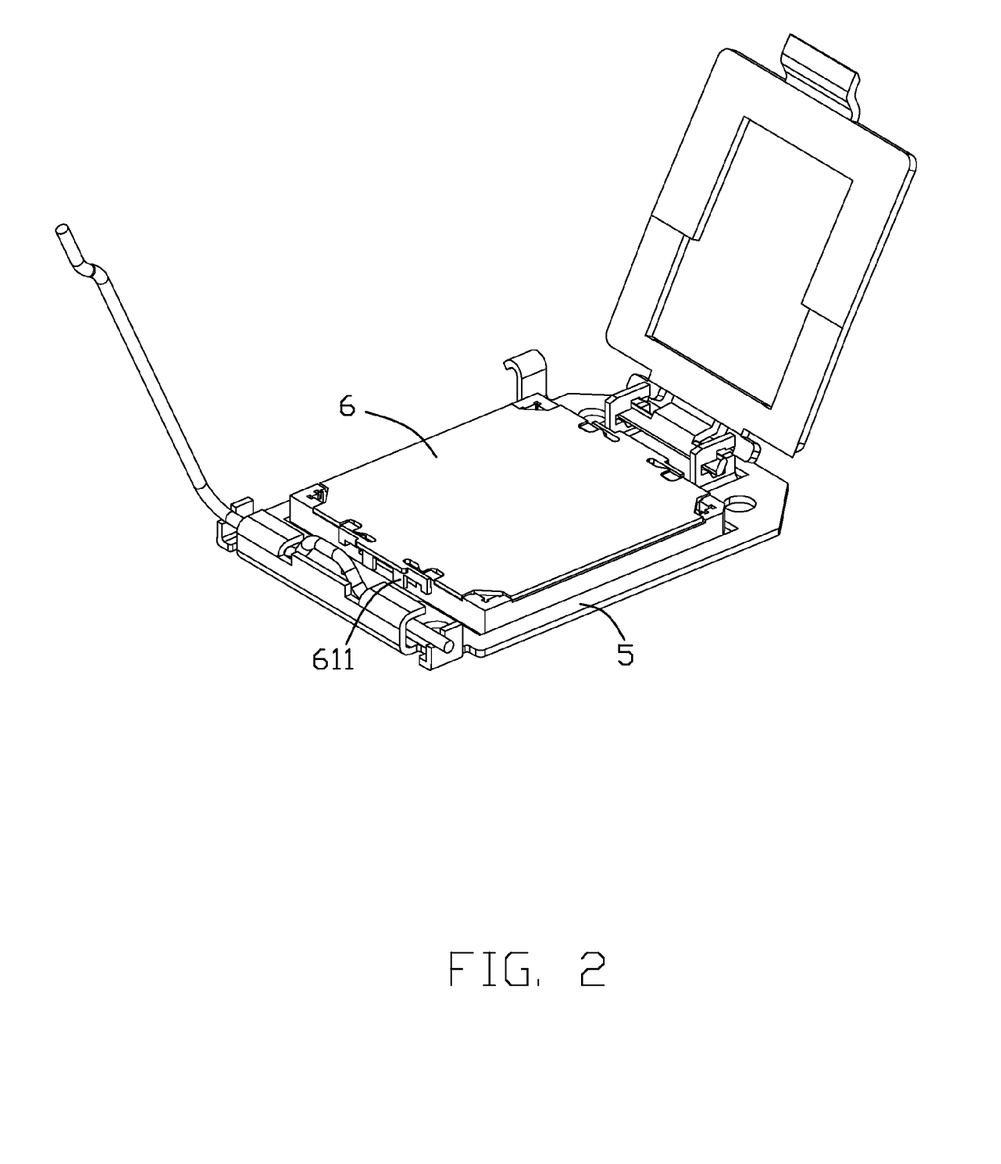
FIG. 2 is a perspective view of a first embodiment of an electrical connector assembly according to the present invention.

FIG. 2 shows an electrical connector assembly for electrically connecting an electronic package (not shown) to a printed circuit board (not shown). The electrical connector assembly comprises an electrical connector 5 and a pick-up cap 6 assembled to the electrical connector 5.

Figure 3:
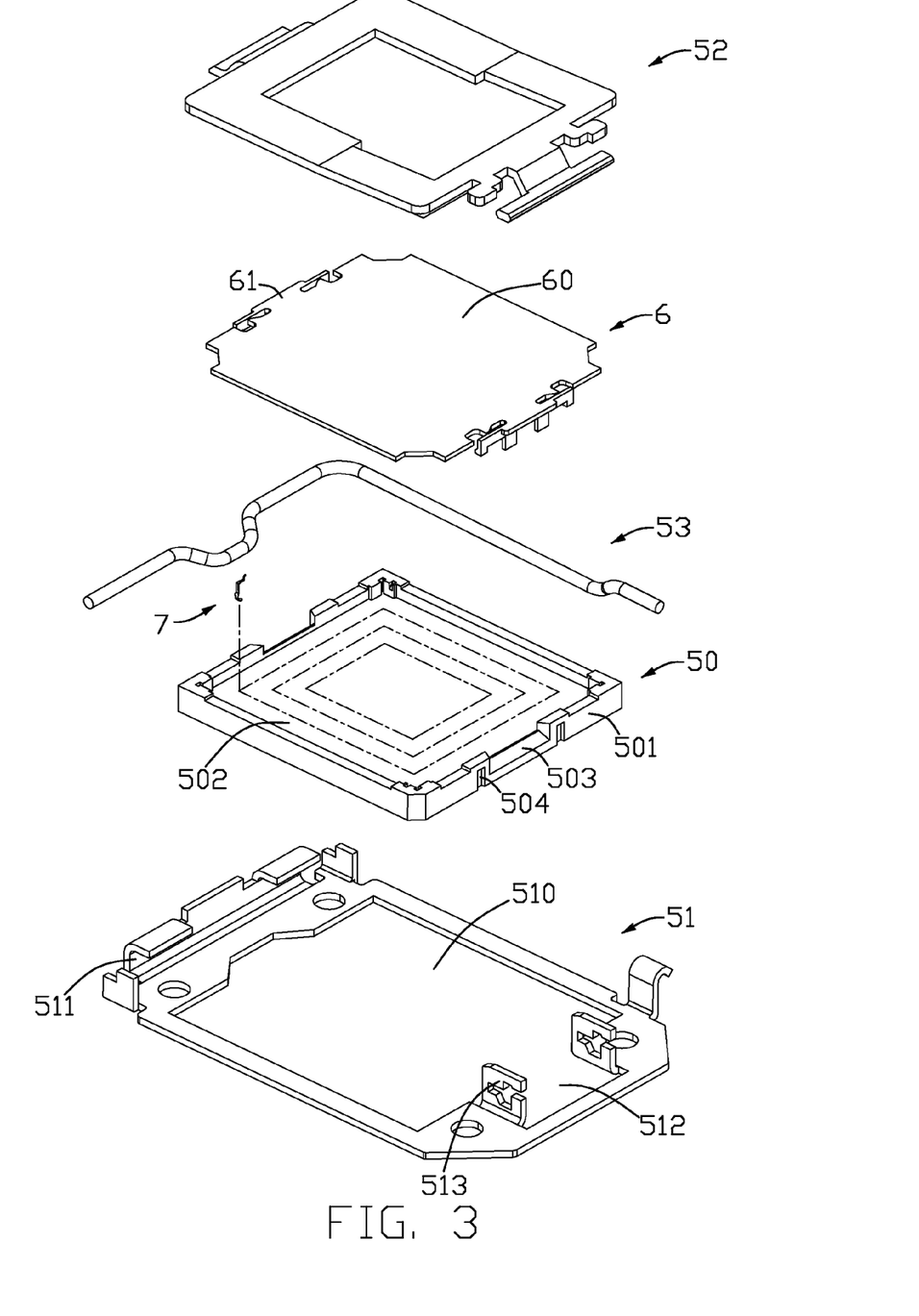
FIG. 3 is an exposed perspective view of the electrical connector of FIG. 2.

FIG. 2 and FIG. 3 show a first embodiment of the present invention. The electrical connector 5 includes an insulative housing 50 with a plurality of contacts 7, a frame 51 surrounding the insulative housing 50, a load plate 52 mounted to one end of the frame 51, and a lever 53 mounted to an opposite end of the frame 51.

The insulative housing 50 is formed with a rectangular configuration and molded from resin or the like. The insulative housing 50 has a plurality of periphery walls 501 extending upwardly from an upper surface of the insulative housing 50. The upper surface and the periphery walls 501 define a cavity 502 to receive the electronic package (not shown). A plurality of passageways (not shown) are defined below the cavity 502 for receiving the contacts 7. A pair of notches 503 are defined on two opposite periphery walls 501 for transmitting heat of the electrical connector in use and faciliting the electronic package (not shown) removing from the cavity 502 of the insulative housing 50. A plurality of recesses 504 are defined on outer walls of the periphery wall 501 for engaging with the pick-up cap 6.

The frame 51 is formed with an opening 510 in a center. The insulative housing 50 is received in the opening 510 and has a gap (not labeled) between it and edges of the opening 510. An aperture 512 is defined on a second end of the frame 51 and communicates with the opening 510. The frame 51 has a shaft-supporting portion 52 at sides of the aperture 512 for attaching with the load plate 52, and a retaining portion 511 at a first end opposite to the second end for receiving the lever 53.

Figure 4:
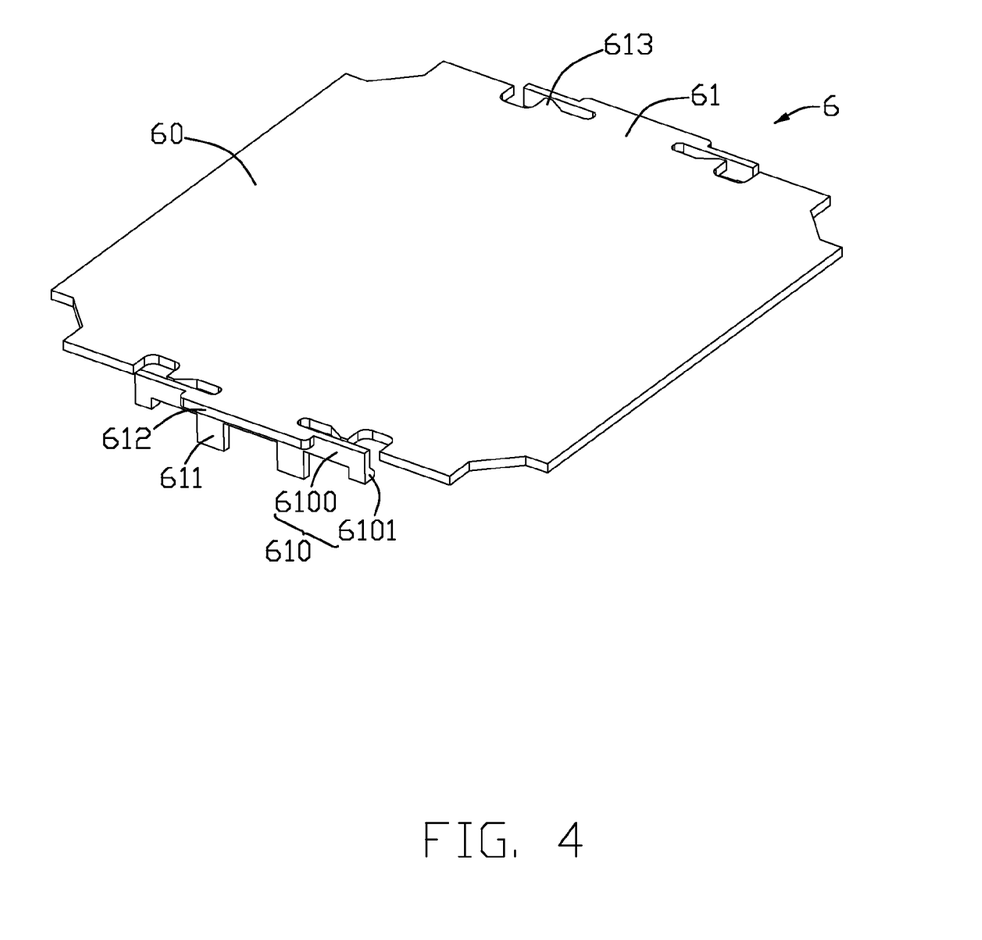
FIG. 4 is a perspective view of a pick-up cap of FIG. 2.
Figure 5:
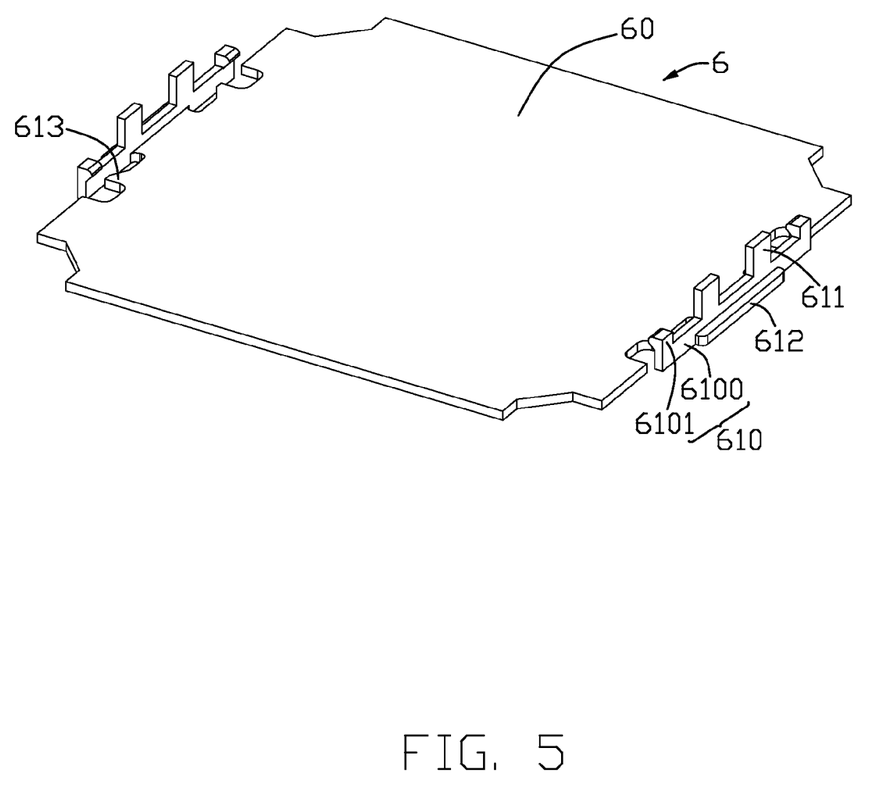
FIG. 5 is an another perspective view of the pick-up cap of FIG. 3.

Referring to FIG. 4 and FIG. 5, the pick-up cap 6 is mounted to the insulative housing 50 and is substantially rectangular. The pick-up cap 6 includes a main portion 60 with a planar top surface picked up by a vacuum nozzle (not shown) for disposing the electrical connector assembly onto the printed circuit board (not shown). The pick-up cap 6 has a first end and a second end corresponding to the first end and the second end of the frame 51, respectively. The main portion 60 has four latches 610 located at the two ends and connected with the main portion 60 by linking portions 61. Each latch 610 includes a spring arm 6100 extending horizontally and a hook 6101 extending downwardly from a free end of the spring arm 6100. The hooks 6101 attach to the recesses 504 of the insulative housing 50 to assemble the pick-up cap 6 to the insulative housing 50. Each latch 610 is formed with a supporting portion 611 extending downwardly therefrom and being longer than the hook 6101 in a vertical direction, so that the supporting portion 611 has a free end lower than the hook 6101. In the present invention, the supporting portions 611 in same end are located between the two adjacent hooks 6101. The supporting portion 611 can be formed only on one of the first or the second end of the main portion 60 or on both the two ends of the main portion 60. Tongues 612 are formed outside of the spring arms 611 for conveniently handling the pick-up cap 6 by an operator. The main portion 60 and latches 61 have a clearance therebetween, and the main portion 60 has a stopper 613 extending toward the corresponding spring arm 6100 for supporting the spring arm 6100 and preventing the spring arm 6100 from breaking resulted from excessive deflection.

Referring to FIG. 2, because the supporting portion 611 is longer and lower than the hook 6101, the supporting portions 611 can lead the hooks 6101 moving along the outer walls of the periphery walls 501 when assembling the pick-up cap 6 to the insulative housing 50. After assembling, the hooks 6101 are attached to the recesses 504 and the supporting portions 611 are located in the notches 503. The supporting portion 611 likes a teeth in the notch 503 but does not block the notch 503, so the electrical connector 5 can also transmit heat through the notch 503 outside.

Figure 6:
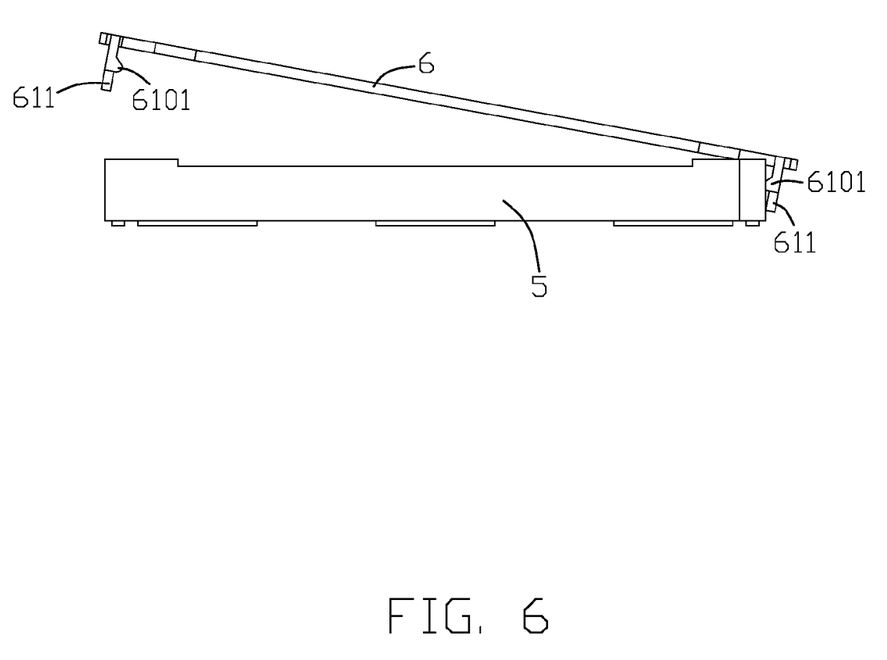
FIG. 6 is a side view, showing the pick-up cap removing from an insulative housing of the electrical connector.

Referring to FIG. 6, in disassembling the pick-up cap 6 from the insulative housing 50, pinch the tongue 612 at the first end and raise this end, then the supporting portions 611 at the second end abut against the outer wall of the insulative housing 50, and the hooks 6101 are released from the recesses 504 in the meantime. Accordingly, the pick-up cap 6 can be facilely taken from the insulative housing 50, and the supporting portions 611 can protect the hooks 6101 from inserting into the gap and breaking resulted from excessive rotation.

Figure 7:
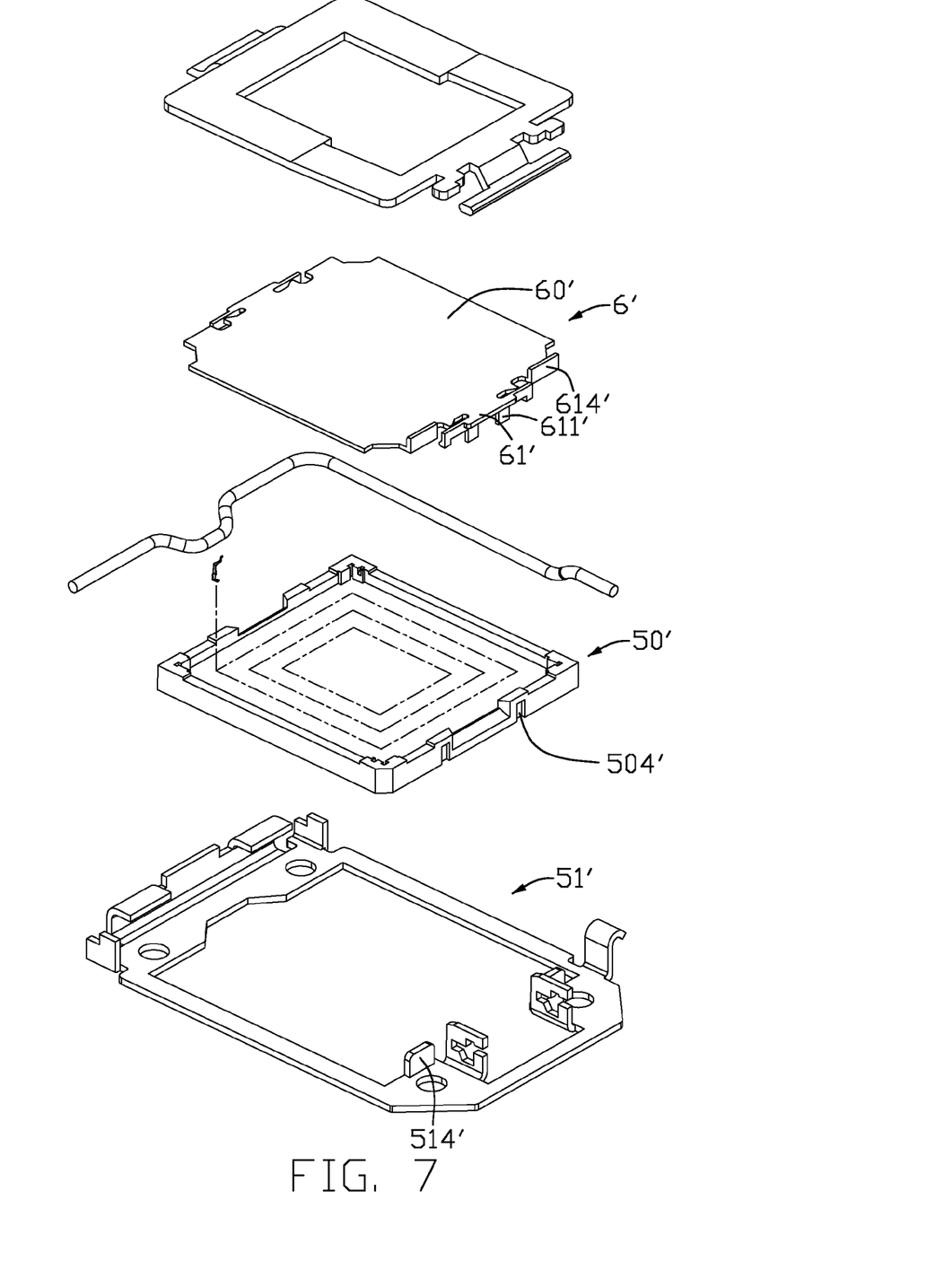
FIG. 7 is a perspective view of a second embodiment of an electrical connector assembly according to the present invention.
Figure 8:
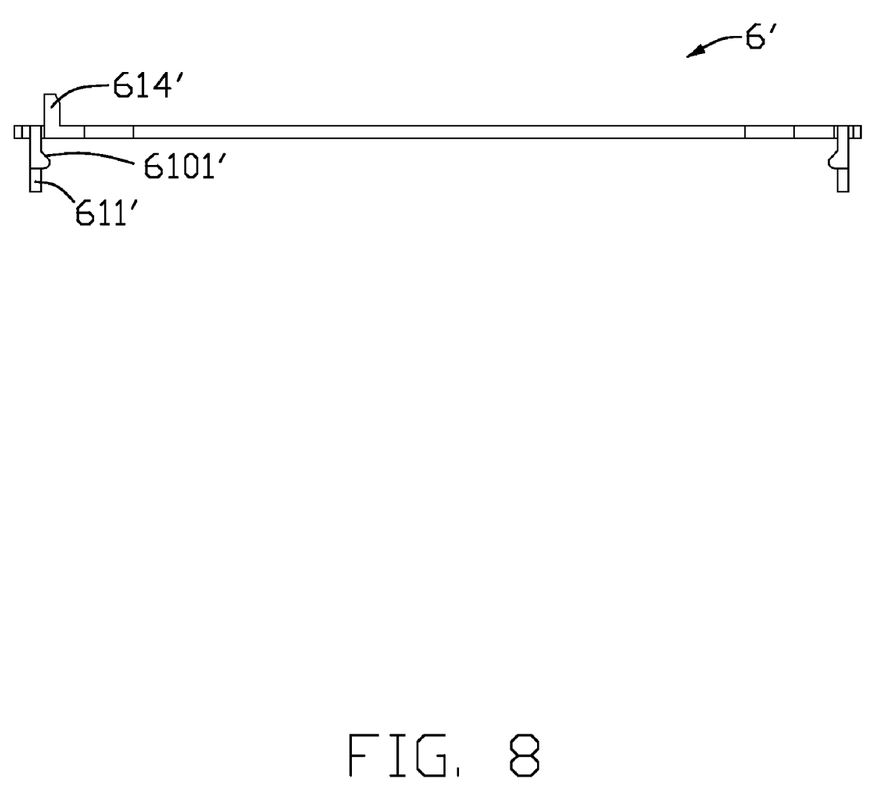
FIG. 8 is a side view of a pick-up cap of FIG. 7.
Figure 9:
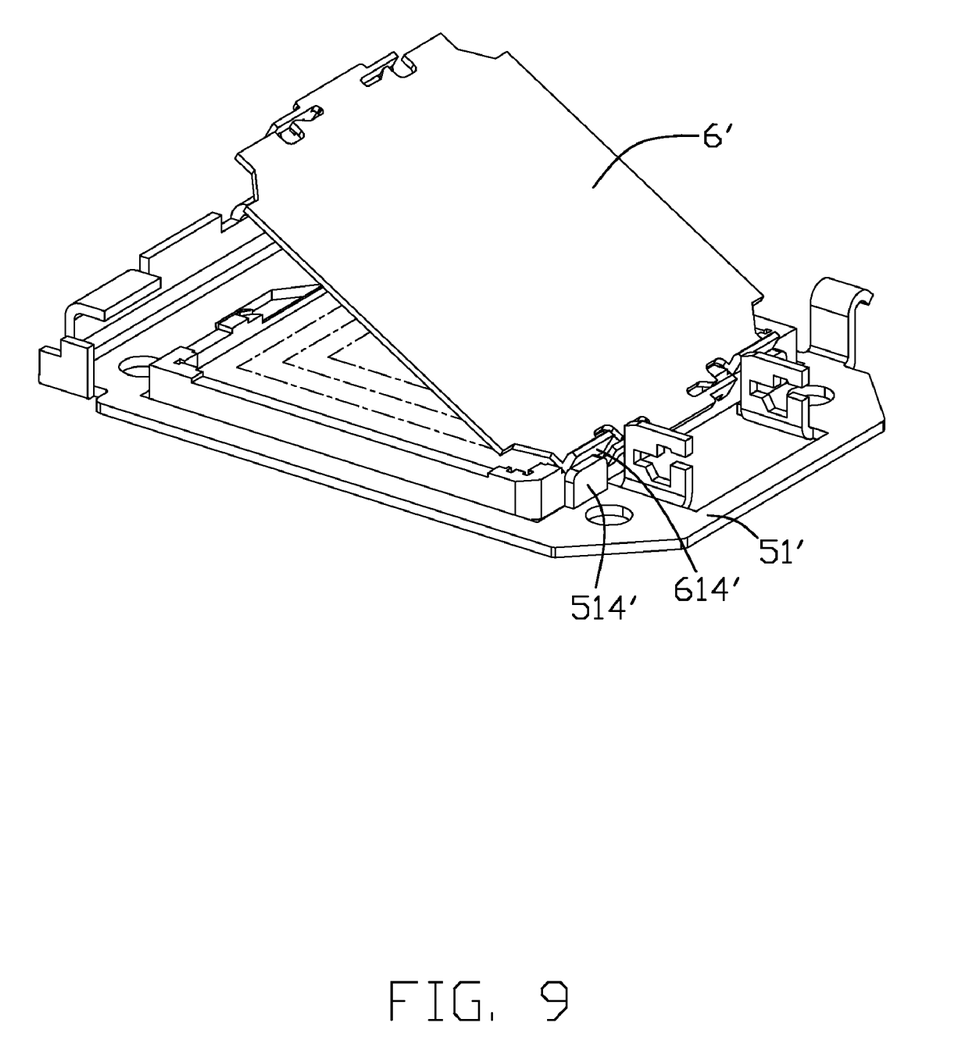
FIG. 9 is a perspective view, showing the pick-up cap removing from an insulative housing of the electrical connector in the second embodiment.

FIG. 7 to FIG. 9 show another embodiment of the present invention. In this embodiment, the structure of the electrical connector assembly is similar to that in the first embodiment, the pick-up cap 6' has a main portion 60' and a plurality of latches linked by linking portions 61', the difference is that a pick-up cap 6' has two upwardly extending walls 614' at an end thereof, and a frame 51' has protrusions 514' corresponding to the walls 614' of the pick-up cap 6'. In disassembling the pick-up cap 6' from the insulative housing 50', raising another end of the pick-up cap 6', then the walls 614' at the end abut against the protrusions 514' for protecting the hooks 6101' from inserting into a gap between the insulative housing 50' and the frame 51' and breaking resulted from excessive rotation, and the pick-up cap 6' rotates about the protrusions 514', under that condition, a supporting portion 611' pushes an outer wall of the insulative housing 50' to release the hooks 6101' from recesses 504'.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A pick-up cap, comprising:
   a main portion having a planar top surface and a first end and a second end opposite to the first end;
   at least two latches extending from the main portion and positioned at the two ends of the main portion, respectively, each latch having a hook extending downwardly; and
   at least one supporting portion extending downwardly from at least one of the first and the second ends and extending downwardly to be lower than the hook in a vertical direction wherein the latch comprising a spring arm extending horizontally from the main portion, and the hook is formed at a free end of the spring arm, the pick-up cap is formed with two latches on each end thereof, the two spring arms of the two latches are connected with each other and positioned in a line; and wherein the supporting portion extends from the spring arm and is located between two adjacent hooks.

2. The pick-up cap as claimed in claim 1, wherein a tongue is formed outside of the spring arms for conveniently handing and raising the pick-up cap.

3. The pick-up cap as claimed in claim 2, wherein the main portion and the latch have a clearance therebetween, and the main portion has a stopper extending toward the corresponding spring arm for supporting the spring arm and preventing the spring arm from excessive deflection.

4. An electrical connector assembly, comprising:
   a frame having an opening thereof;
   an insulative housing positioned in the opening of the frame, the insulative housing having an cavity in a center thereof and a plurality of recesses formed on outer walls; and
   a pick-up cap assembled to the insulative housing and having a first end and a second end opposite to the first end, the pick-up cap comprising a main portion having a planar top surface, a plurality of latches extending from the two ends of the main portion and corresponding to the recesses, respectively, each latch having a hook extending downwardly for engaging with the recess of the insulative housing; a supporting portion formed on at least one of the first and the second ends of the pick-up cap and extending downwardly from the pick-up cap, the supporting portion disposed lower than the hook so that the supporting portion abut against the outer wall while disassembling the pick-up cap from the insulative housing wherein the pick-up cap has a wall extending upwardly form the second end and the frame has a protrusion corresponding to the wall for supporting the wall during removing the pick-up cap from the insulative housing.

5. The electrical connector assembly as claimed in claim 4, wherein during disassembling the pick-up cap from the insulative housing, raise the first end of the pick-up cap is lifted upwardly, then the supporting portion on the second end abuts against the outer wall of the insulative housing, and the hook on the second end is released from the recess.

6. The electrical connector assembly as claimed in claim 4, wherein the latch comprises a spring arm extending horizontally from the main portion, and the hook is formed at a free end of the spring arm, the pick-up cap is formed with two latches on each end thereof, the two spring arms of the two latches are connected with each other and positioned in a line.

7. The electrical connector assembly as claimed in claim 6, wherein the supporting portion extends from the spring arm and is located between two adjacent hooks.

8. The electrical connector assembly as claimed in claim 4, wherein the supporting portion likes a teeth in a notch of the insulative housing but does not block the notch, so the insulative housing can also transmit heat through the notch outside.

9. An electrical connector assembly comprising:
an insulative housing defining an upward receiving cavity surrounded by a periphery wall which defines a locking recess in an outer face thereof;
a metallic stiffener defining a peripheral structure surrounding the periphery wall of the housing; and
a pick up cap assembled upon the housing and covering the receiving cavity, said pick up cap defining opposite first and second ends, a resilient latch formed on the first end with a locking head latchably engaged within the locking recess; wherein
at least one relative stiff supporting protrusion extends on the first end, which forms a fulcrum against the periphery wall when said pick up cap is upwardly rotated about said first end so as to assure said locking head is withdrawn from the locking recess when removal of the pick up cap from the housing wherein said pick up cap further includes an upward protrusion which abuts against the peripheral structure of the stiffener when said pick up cap is rotated to an outer position so as to result in an upward force around the first end to ease upward movement of the pick up cap at said end.

10. The electrical connector as claimed in claim 9, wherein said supporting protrusion defines a lower end which is lower than the locking head.

11. The electrical connector as claimed in claim 10, wherein said supporting protrusion is formed on the resilient latch.

12. The electrical connector as claimed in claim 9, wherein said locking recess extends through a bottom face of the housing for injection molding consideration.

* * * * *